United States Patent
Kong et al.

(10) Patent No.: US 11,043,634 B2
(45) Date of Patent: Jun. 22, 2021

(54) CONFINING FILAMENT AT PILLAR CENTER FOR MEMORY DEVICES

(71) Applicant: INTERNATIONAL BUSINESS MACHINES CORPORATION, Armonk, NY (US)

(72) Inventors: Dexin Kong, Guilderland, NY (US); Takashi Ando, Tuckahoe, NY (US); Kangguo Cheng, Schenectady, NY (US); Juntao Li, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 20 days.

(21) Appl. No.: 16/378,988

(22) Filed: Apr. 9, 2019

(65) Prior Publication Data

US 2020/0328346 A1 Oct. 15, 2020

(51) Int. Cl.
*H01L 45/00* (2006.01)

(52) U.S. Cl.
CPC ...... *H01L 45/1246* (2013.01); *H01L 45/1233* (2013.01); *H01L 45/1273* (2013.01); *H01L 45/145* (2013.01); *H01L 45/146* (2013.01); *H01L 45/08* (2013.01); *H01L 45/1616* (2013.01); *H01L 45/1625* (2013.01); *H01L 45/1666* (2013.01)

(58) Field of Classification Search
CPC ............ H01L 45/1273; H01L 45/1246; H01L 45/1233; H01L 45/08–10
See application file for complete search history.

(56) References Cited

U.S. PATENT DOCUMENTS

| 8,872,149 B1 * | 10/2014 | Hsieh ............ H01L 45/12 257/2 |
| 9,006,698 B2 | 4/2015 | Wei et al. |
| 9,018,615 B2 | 4/2015 | Lai et al. |
| 9,209,392 B1 * | 12/2015 | Sung ............ H01L 45/08 |
| 9,412,942 B2 | 8/2016 | Walls et al. |
| 9,805,793 B2 | 10/2017 | Rajamohanan et al. |
| 10,003,021 B2 | 6/2018 | Walls et al. |

(Continued)

FOREIGN PATENT DOCUMENTS

EP 1653473 A2 3/2006

OTHER PUBLICATIONS

Niu, "Geometric Conductive Filament Confinement by Nanotips for Resistive Switching of HfO2-RRAM Devices with High Performance", Scientific Reports, May 2016, 9 pages.

(Continued)

*Primary Examiner* — Kevin Parendo
(74) *Attorney, Agent, or Firm* — Tutunjian & Bitetto, P.C.; Randall Bluestone

(57) ABSTRACT

A semiconductor device with resistive memory includes a bottom electrode disposed on a base structure, the bottom electrode having a structure that tapers up from the base structure to a tip of the bottom electrode. The semiconductor device also includes sidewall spacers on the sides of the bottom electrode, an interlayer dielectric deposition (ILD) outside the sidewall spacers, and a top dielectric layer disposed over the bottom electrode, and the sidewall spacers. The semiconductor device further includes a top electrode deposited over the bottom electrode within the sidewall spacers. A filament formation region is formed at the tip of the bottom electrode.

8 Claims, 9 Drawing Sheets

(56) References Cited

U.S. PATENT DOCUMENTS

| | | | |
|---|---|---|---|
| 2007/0012956 A1* | 1/2007 | Gutsche | H01L 45/16 257/246 |
| 2008/0247226 A1* | 10/2008 | Liu | H01L 27/2409 365/163 |
| 2011/0053335 A1* | 3/2011 | Sasaki | H01L 45/1233 438/382 |
| 2013/0112936 A1* | 5/2013 | Wei | H01L 45/08 257/4 |
| 2016/0190441 A1* | 6/2016 | Walls | H01L 45/1273 257/4 |
| 2018/0040809 A1* | 2/2018 | Moon | H01L 43/08 |
| 2018/0190903 A1 | 7/2018 | Park et al. | |
| 2019/0198572 A1* | 6/2019 | Ando | H01L 29/42376 |

OTHER PUBLICATIONS

Wong, "Metal-Oxide RRAM", Proceedings of the IEEE, vol. 100, No. 6, Jun. 2012, pp. 1951-1970.

* cited by examiner

CONFINING FILAMENT AT PILLAR CENTER FOR MEMORY DEVICES

BACKGROUND

The present invention generally relates to semiconductor devices, and more particularly to resistive random-access memory, and methods of forming the same.

A memory cell is a component of a computer memory device that includes an electronic circuit that stores one bit of binary information. One type of memory cell is a random-access memory (RAM) cell. Examples of RAM memory devices include, e.g., volatile memory devices and non-volatile memory devices. A non-volatile memory can include a resistive random-access memory (RRAM or ReRAM). ReRAM technology works by creating defects in a thin dielectric layer (e.g., oxygen vacancies in a thin metal oxide layer), which can charge and drift under an electric field. The motion of ions and vacancies in the thin dielectric layer is similar to the motion of electrons and holes in a semiconductor.

SUMMARY

In accordance with an embodiment of the present invention, a semiconductor device that has resistive memory includes a bottom electrode disposed on a base structure, the bottom electrode having a structure that tapers up from the base structure to a tip of the bottom electrode. The semiconductor device also includes sidewall spacers on the sides of the bottom electrode, an interlayer dielectric deposition (ILD) outside the sidewall spacers, and a top dielectric layer disposed over the bottom electrode, and the sidewall spacers. The semiconductor device further includes a top electrode deposited over the bottom electrode within the sidewall spacers. A filament formation region is formed at the tip of the bottom electrode.

In accordance with an embodiment of the present invention, a semiconductor device with resistive memory includes a bottom electrode, sidewall spacers, an interlayer dielectric deposition (ILD), a top dielectric layer, and a top electrode. The bottom electrode is disposed on a base structure and has a structure that tapers up from the base structure to a tip of the bottom electrode. The sidewall spacers are on the sides of the bottom electrode. The ILD is disposed outside the sidewall spacers. The top dielectric layer is disposed over the bottom electrode, and the sidewall spacers. The top electrode is deposited over the bottom electrode within the sidewall spacers, and a filament formation region is formed at the tip of the bottom electrode extending into the top electrode.

In accordance with an embodiment of the present invention, a method for fabricating a semiconductor device including resistive memory includes forming a patterned bottom electrode. The method also includes creating sidewall spacers on the sides of the patterned bottom electrode, depositing an interlayer dielectric deposition (ILD) around the sidewall spacers, and isotropically etching the bottom electrode within the sidewall spacers to form a tapered structure bottom electrode. The method further includes depositing a second dielectric layer over the ILD and the tapered structure bottom electrode, and depositing a top electrode over the second dielectric layer within the sidewall spacers on the tapered structure bottom electrode.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
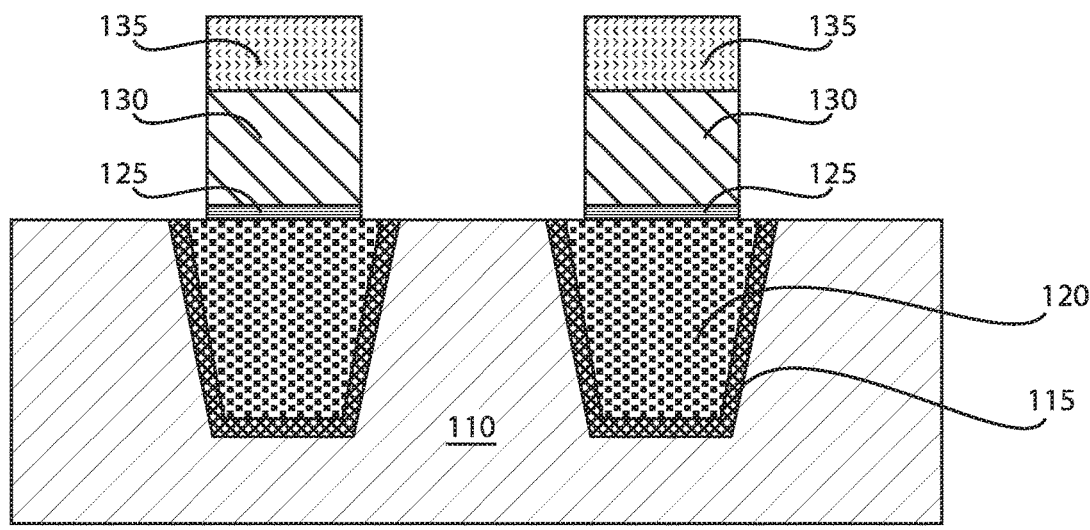
FIG. 1 is a cross-sectional view showing bottom electrode patterning, in accordance with an embodiment of the present invention.

Embodiments of the present invention relate generally to reducing variability of switching characteristics by precisely controlling the location of a centrally disposed filament of a resistive random-access memory (RRAM) pillar. The basic unit of information in filamentary-based resistive switching memories is physically stored in the conductive filament. The various embodiments described herein achieve reduced the variability of switching characteristics by converging the electric field at the tip located at the upper center of the bottom electrode during the electroforming process. The tip is formed in a self-aligned manner by using spacers and isotropic etching of the bottom electrode material. This RRAM structure has significantly benefits, especially for small RRAM device structure where edge effects become obvious during filament formation.

Embodiments of the present invention also relate generally to forming a confined filament (or a controlled filament) that includes a pillar, and a tip via processes described herein including isotropic etch. The embodiments described herein avoid (or reduce) damage to barrier layers (for example, high-k dielectric) layers due to reactive ion etching (RIE). The example embodiments control the filament formation location inside the cell to guide the formation to a particular area (e.g., close to the center of the cell), thereby reducing the impact of edge effects to variations in filament formation.

Embodiments of the present invention also relate generally to creating a sharp tip structure at the pillar center (for example, at the top surface of bottom electrode (sub nanometer (nm) range)) to control the formation of filament at the pillar center.

Exemplary applications/uses to which the present invention can be applied include, but are not limited to forming a RRAM structure that has significant benefits for reducing variability of switching characteristics, especially for small RRAM device structures where edge effects become obvious during filament formation.

In various embodiments, the materials and layers can be deposited by physical vapor deposition (PVD), chemical vapor deposition (CVD), atomic layer deposition (ALD), molecular beam epitaxy (MBE), or any of the various modifications thereof, for example, plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PEALD). The depositions can be epitaxial processes, and the deposited material can be crystalline. In various embodiments, formation of a layer may be by one or more deposition processes, where, for example, a conformal layer can be formed by a first process (e.g., ALD, PEALD, etc.) and a fill can be formed by a second process (e.g., CVD, electrodeposition, PVD, etc.).

It should be noted that materials may be referred to only by their composition constituent, e.g., silicon, nitrogen, oxygen, carbon, hafnium, titanium, etc., without specifying a particular stoichiometry (e.g., SiGe, $SiO_2$, $Si_3N_4$, $HfO_2$, etc.) in recognition that the stoichiometry can vary based on formation processes, processing parameters, intentional non-stoichiometric fabrication, deposition tolerance, etc. Reference to only the composition constituents (e.g., SiO, SiN, TiN, etc.) is, therefore, intended to refer to all suitable stoichiometric ratios for the identified composition. In addition, other elements can be included in the compound and still function in accordance with the present principles. The compounds with additional elements will be referred to herein as alloys.

It should also be understood that material compounds will be described in terms of listed elements, e.g., SiGe. These compounds include different proportions of the elements within the compound, e.g., SiGe includes $Si_xGei_{1-x}$ where x is less than or equal to 1, etc.

It is to be understood that aspects of the present invention will be described in terms of a given illustrative architecture; however, other architectures, structures, substrate materials and process features and steps can be varied within the scope of aspects of the present invention.

It should be noted that certain features may not be shown in all figures for the sake of clarity. This is not intended to be interpreted as a limitation of any particular embodiment, or illustration, or scope of the claims.

FIGS. 1 to 7 collectively and sequentially illustrate an example embodiment of processes that may be implemented for precisely controlling the location of the filament at the center of a RRAM pillar. The processes described with respect to FIGS. 1 to 7 achieve this by converging the electric field at the tip located at the center of the bottom electrode during the electroforming process.

Referring now to the drawings in which like numerals represent the same or similar elements and initially to FIG. 1, a cross-sectional view showing formation of a device 100 including bottom electrode (BE) patterning is illustrated.

The device 100 can be formed from an initial structure that includes a substrate (for example, a dielectric layer) 110 with conductive lines 120 (e.g., copper (Cu) lines) embedded (for example, formed, buried) within trenches formed along a surface of the substrate 110. The conductive line 120 is separated from the substrate 110 using, for example, a lower diffusion barrier 115 (e.g., a tantalum nitride (TaN) barrier).

The substrate 110 may be selected from the group consisting of silicon-containing materials such as $SiO_2$, $Si_3N_4$, $SiO_xN_y$, SiC, SiCO, SiCOH, and SiCH compounds; the above-mentioned silicon-containing materials with some or all of the Si replaced by Germanium; carbon-doped oxides; inorganic oxides; inorganic polymers; hybrid polymers; organic polymers such as polyamides; other carbon-containing materials; organo-inorganic materials such as spin-on glasses and silsesquioxane-based materials; and diamond-like carbon (DLC, also known as amorphous hydrogenated carbon, a-C:H).

The substrate 110 may be formed by, for example, various methods such as spinning from solution, spraying from solution, chemical vapor deposition (CVD), plasma enhanced CVD (PECVD), sputter deposition, reactive sputter deposition, ion-beam deposition, and evaporation, etc.

In one or more embodiments, the lower diffusion barrier layer 115 can be formed by a deposition process. In various embodiments, the lower diffusion barrier layer 115 can be carbon (C), a conductive metal compound, including, but not limited to, transition metal nitrides, for example, tantalum nitride, titanium nitride (TiN), tungsten nitride (WN), transition metal carbides, for example, tantalum carbide (TaC), titanium carbide (TiC), tungsten carbide (WC), and combinations thereof, where the combination can be a multilayer.

A barrier layer of conductive material 125 is added to the surface of the substrate 110. In an example embodiment, physical vapor deposition (PVD) of a conductive material (for example, a conducting metallic compound material, such as tantalum nitride) can be performed across a surface of the substrate 110 (which may thereby enclose the conductive lines 120 within the barriers (115 and 125)).

A bottom electrode 130 is deposited on upper surface of the device 100 (e.g., over the barrier layer 125). The bottom electrode 130 can be formed by depositing a bottom electrode layer material, and planarizing the bottom electrode layer material (e.g., by using chemical-mechanical planarization (CMP)). The bottom electrode 120 can include any suitable material in accordance with the embodiments described herein. Examples of suitable materials that can be included in the bottom electrode 120 include, but are not limited to, titanium-based materials (e.g., titanium nitride materials (e.g., TiN)), tantalum-based materials (e.g., tantalum nitride materials (e.g., TaN)), and tungsten-based materials (e.g., W). After each deposition, excess material can be planarized and/or recessed from the semiconductor device with a suitable etch or planarization process. The bottom electrode 130 may be composed of one uniform material.

A mask 135 can be formed on a surface of the bottom electrode 130. The mask 135 can include soft and/or hardmask materials and can be formed using deposition, photolithography and etching. In one embodiment, the mask 135 can be a hardmask. For example, the mask 135 can include a nitride-containing material, such as, e.g., a silicon nitride material (e.g., SiN, a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), or combinations thereof). However, the mask 135 can include any suitable dielectric material that can be deposited by, e.g., chemical vapor deposition (CVD) and related methods. Other compositions for the mask 135 include, but are not limited to, silicon oxides, silicon carbides, etc. Spin-on dielectrics that can be utilized as a material for the mask 135 can include, but are not limited to: silsequioxanes, siloxanes, and boron phosphate silicate glass (BPSG).

In one or more embodiments, the mask 135 and the underlying bottom electrode (and barrier layer 125) are patterned.

In various embodiments, the mask 135 and the underlying bottom electrode 130 (and barrier layer 125) are etched along the conductive lines 120 forming vertical stacks. Portions of the bottom electrode 130 and barrier layer 125 are removed from the surface of the substrate 110, thereby exposing the substrate 110.

Figure 2:
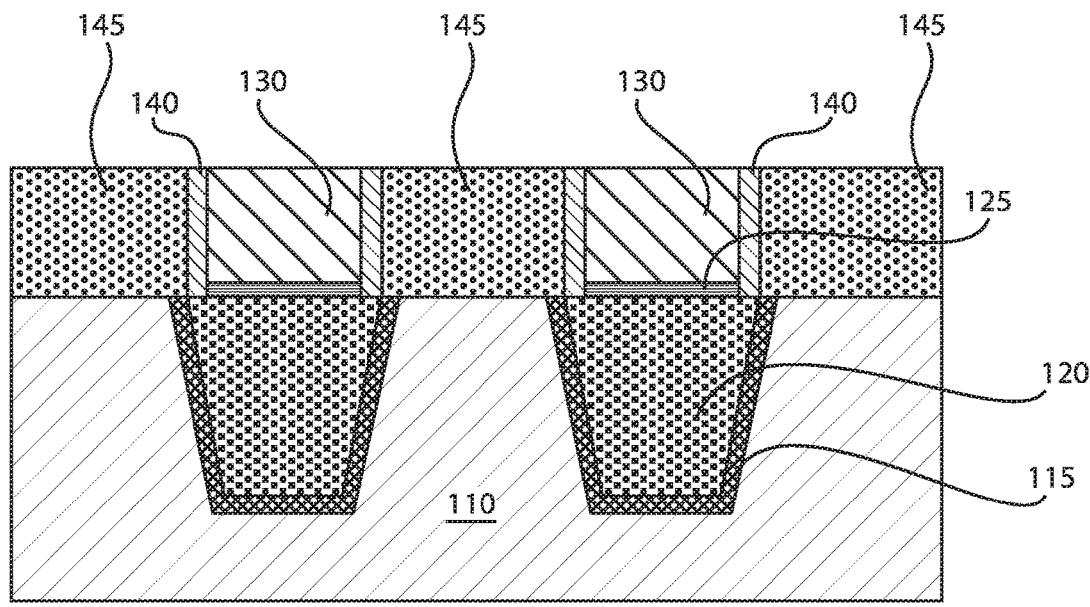
FIG. 2 is a cross-sectional view showing conformal interlayer dielectric deposition (ILD) deposition and chemical-mechanical planarization (CMP) stopping on the bottom electrode layer, in accordance with an embodiment of the present invention.

With reference to FIG. 2, a cross-sectional view illustrating conformal interlayer dielectric (ILD) deposition and CMP stopping on the barrier layer is shown.

As shown, the mask 135 is removed from the stack that includes the bottom electrode 130. Sidewall spacers 140 are formed by etch back of a spacer layer 140 that is deposited along the sides of the bottom electrode 130. The sidewall spacer layer 140 can be conformally formed along the sidewalls of the stack. For example, the sidewall spacer layer 140 can be deposited conformally by using ALD or CVD process. The sidewall spacer layer 140 can include any suitable dielectric material in accordance with the embodiments described herein. In one embodiment, the sidewall spacer layer 140 can include a low-k dielectric material. Examples of suitable dielectric materials for the spacer 140 include, but are not limited to, oxides, nitrides and/or oxynitrides.

As shown, ILD 145 can be formed on the surface of the substrate 110 (and between the bottom electrodes 130). The ILD 145 can include any materials known in the art, such as, for example, porous silicates, carbon doped oxides, silicon dioxides, silicon nitrides, silicon oxynitrides, or other dielectric materials. The ILD 145 can be formed using any method known in the art, such as, for example, chemical vapor deposition, plasma enhanced chemical vapor deposition, atomic layer deposition, or physical vapor deposition.

CMP of the ILD 145 is stopped on the bottom electrode 130 (for example, titanium nitride).

In one embodiment, the ILD 145 can include a low-k dielectric material. A low-k dielectric material is a material with a small relative dielectric constant as compared to silicon dioxide.

More specifically, the low-k dielectric material of the ILD 145 can have a dielectric constant that is less than about 4.0 (e.g., about 3.9). In one embodiment, the low-k dielectric material of the ILD 145 can have a dielectric constant ranging from, e.g., about 1.75 to about 3.5. In another embodiment, the low-k dielectric material of the ILD 145 have a dielectric constant ranging from, e.g., about 2.0 to about 3.2. Examples of suitable low-k dielectric materials that the ILD 145 can be formed from include, but are not limited to, nitrides (e.g., SiN), carbonitrides (e.g., SiCN, SiBCN, and SiOCN), organosilicate glass (OSG), oxides (e.g., fluorine doped silicon dioxide, carbon doped silicon dioxide, porous silicon dioxide, and porous carbon doped silicon dioxide), spin-on materials (e.g., spin-on organic polymeric dielectrics and spin-on silicon based polymeric dielectrics), etc.

Figure 3:
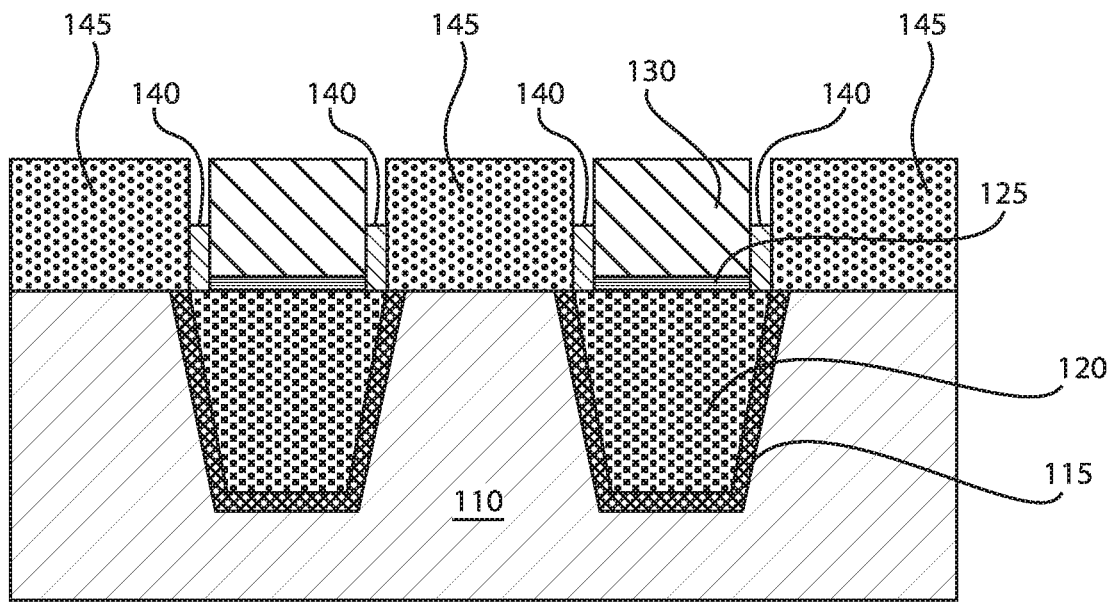
FIG. 3 is a cross-sectional view showing sidewall spacer etch, in accordance with an embodiment of the present invention.

FIG. 3 is a cross-sectional view showing sidewall spacer etch.

In various embodiments, a sidewall spacer etch can be performed to remove material to form lower sidewall spacers 140. The sidewall spacers 140 are thereby lowered. Any suitable etch process can be used to perform the sidewall spacer etch in accordance with the embodiments described herein. Due to the ultraviolet (UV) condensation process(es) performed on the sidewall spacer(s) 140 to form the hardened lower sidewall spacers, the lower sidewall spacers 140 can prevent epitaxial etch out.

Figure 4:
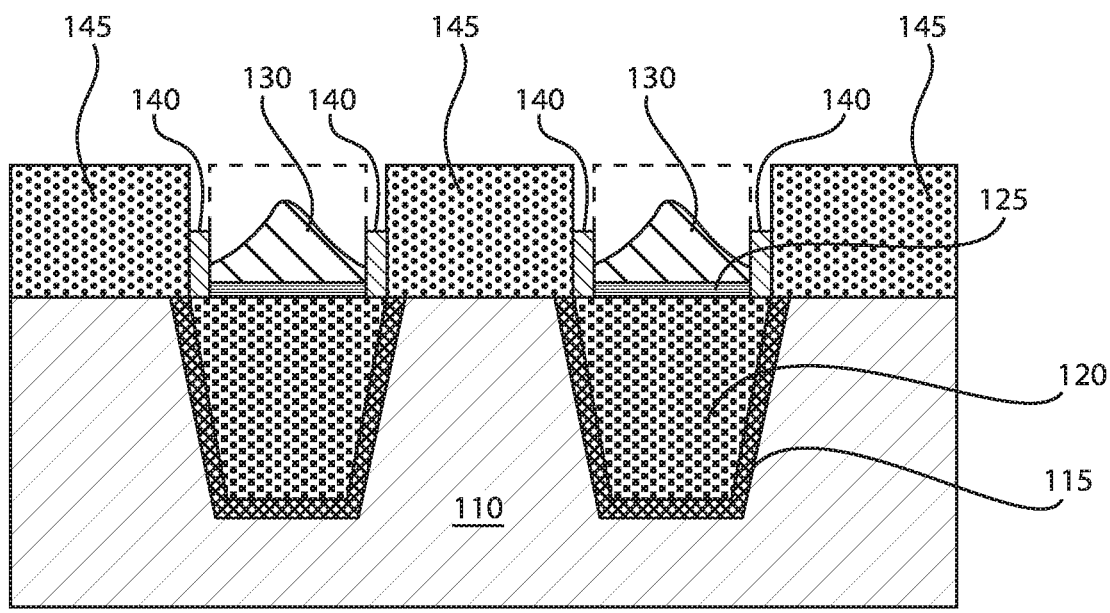
FIG. 4 is a cross-sectional view showing isotropic etch of the bottom electrode, in accordance with an embodiment of the present invention.

FIG. 4 is a cross-sectional view showing isotropic etch of the bottom electrode 130.

The bottom electrode 130 may be etched to form a conical shape using, e.g., an isotropic etch process. The term "isotropic etch" denotes an etch process that is non-directional. By "non-directional" it is meant that the etch rate is not substantially greater in any one direction in comparison to all of the etch directions. The isotropic etch may be a wet chemical etch or a dry etch. For example, the etchant may be a corrosive liquid or a chemically active ionized gas, such as a plasma.

The etch process can be designed to selectively etch the bottom electrode 130 by, for example, using a chemistry that is selective to the chemical content of the bottom electrode 130. For example, in an embodiment in which the bottom electrode 130 includes high germanium content, the chemistry of the etch process may be designed for selectively etching the high germanium content (e.g., SiGe).

Figure 5:
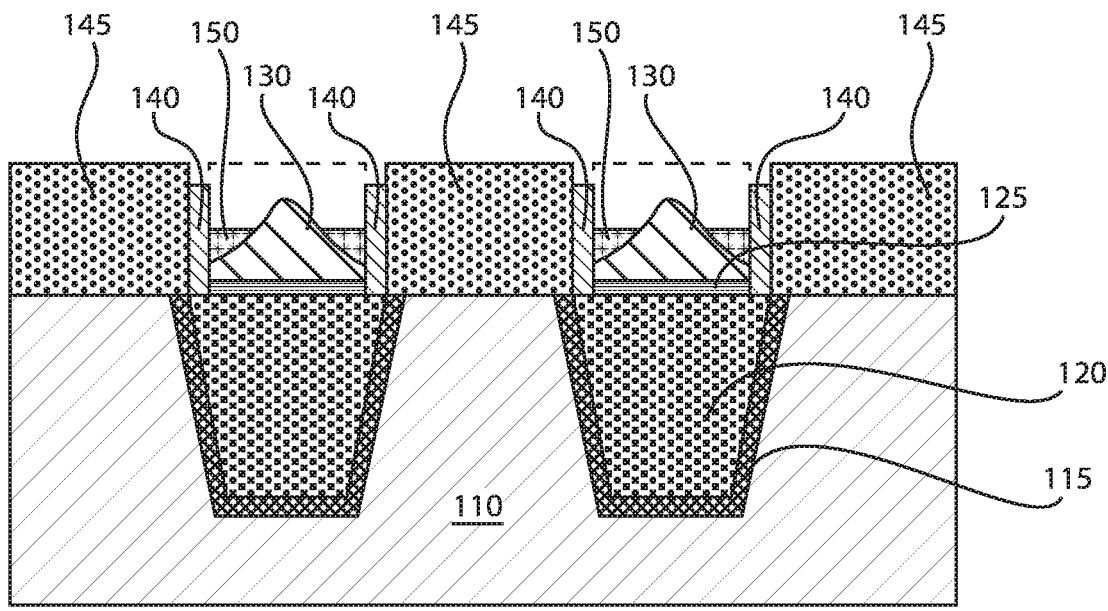
FIG. 5 is a cross-sectional view showing second ($2^{nd}$) spacer deposition to pinch off the bottom tip region and second spacer etch back, in accordance with an embodiment of the present invention.

FIG. 5 is a cross-sectional view showing second ($2^{nd}$) spacer 150 deposition to pinch off the bottom tip region of the bottom electrode 130 and second spacer etch back.

As shown in FIG. 5, a second (inner) spacer layer 150 is formed. The second spacer layer 150 can be conformally formed around the bottom electrode 130 within the first (sidewall) spacers 140. For example, the second spacer layer 150 can be deposited conformally by using ALD or CVD process. The second spacer layer 150 can include any suitable dielectric material in accordance with the embodiments described herein. For example, the second spacer layer 150 can include a low-k dielectric material. In one embodiment, the second spacer layer 150 can include the same material as the sidewall spacer layer 140. In another embodiment, the second spacer layer 150 can include a different material than the sidewall spacer layer 140.

Second spacer layer 150 can be etched back from the bottom electrode 130 resulting in the upper portion of the cone shape of the bottom electrode 130 being exposed while the lower portion of the bottom electrode 130 is covered by the second spacer layers 150. The second spacer layer 150 may thereby pinch off the bottom tip region of the bottom electrode 130.

Figure 6:
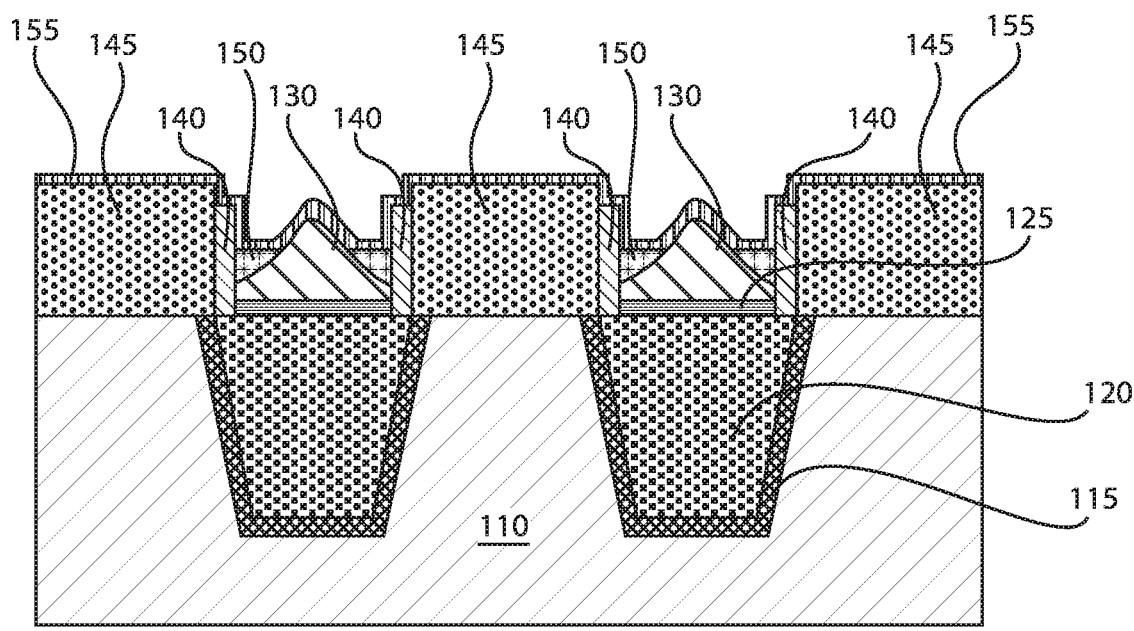
FIG. 6 is a cross-sectional view showing addition of a top dielectric layer, in accordance with an embodiment of the present invention.

FIG. 6 is a cross-sectional view showing addition of a conformal dielectric layer (for example, high-k deposition).

In various example embodiments, (for example, conformal) dielectric layers 155 (for example, high-k dielectric layers) are formed on the surface of the device including over (the exposed portions of) the ILD 145, the sidewall spacers 140, the second spacer 150 and the bottom electrode 130. The switching material of the high-k dielectric layers 155 continuously covers the cone-shaped bottom electrode 130.

A dielectric layer 155 can be deposited by any suitable techniques, such as, e.g., ALD, CVD, metal-organic CVD (MOCVD), physical vapor deposition (PVD), thermal oxidation, combinations thereof, or other suitable techniques. In one embodiment, a high-k material can be employed. Examples of high-k materials include but are not limited to metal oxides, such as, silicon oxide (SiO), hafnium oxide (HfO), hafnium silicon oxide (HfSiO), hafnium silicon oxynitride (HfSiON), lanthanum oxide (LaO), lanthanum aluminum oxide (LaAlO), zirconium oxide (ZrO), zirconium silicon oxide (ZrSiO), zirconium silicon oxynitride (ZrSiON), tantalum oxide (TaO), titanium oxide (TiO), etc. The high-k material may further include dopants such as lanthanum, aluminum, magnesium, or combinations thereof.

Figure 7:
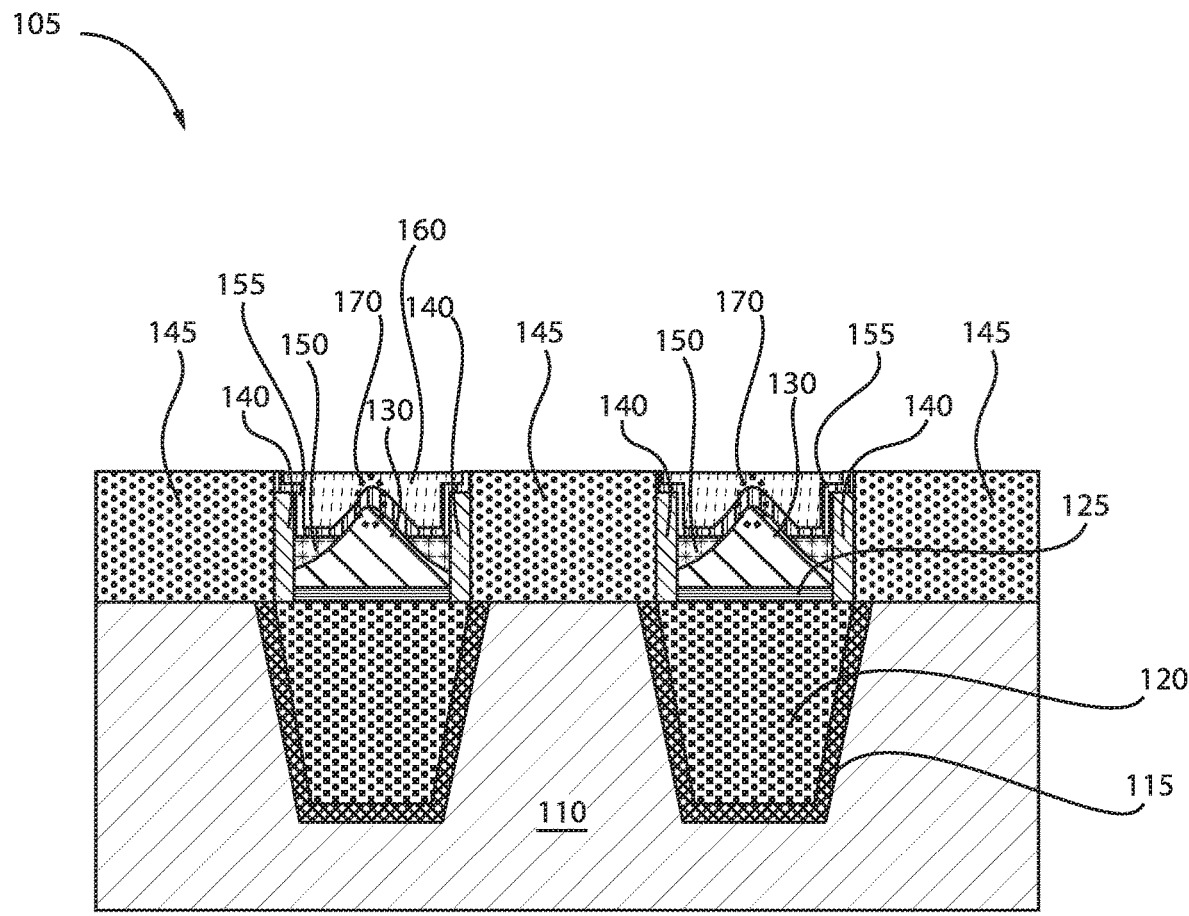
FIG. 7 is a cross-sectional view showing top electrode (TE) material deposition and CMP stopping on low-k dielectric, in accordance with an embodiment of the present invention.

FIG. 7 is a cross-sectional view showing top electrode (TE) material deposition and CMP stopping on low-k dielectric.

Top electrode (TE) 160 material deposition is performed on the upper surface of the structure. The top electrode 160 is controllably disposed with a tapered filament in the center of each cell. In one embodiment, the shape of the top electrode 160 is asymptotic. Top electrode 160 can include, but is not limited to, materials such as titanium-based materials (e.g., titanium nitride materials (e.g., TiN))/Al-containing alloys/TiN and tungsten (W). The top electrode 160 deposition is followed by CMP stopping on low-k dielectric. The resulting structure reduces the variability of switching characteristics by precisely controlling the location of the filament at the center of the RRAM pillar. The device 105 illustrates this structure that converges the electric field in the filament formation region 170 at the tip (or tapering summit of a conical structure) located at the center of the bottom electrode during the electroforming process. The tip is formed in a self-aligned manner by using spacers and isotropic etching of the bottom electrode material.

The example embodiments include a single filament in each cell at the device center. In one embodiment, the bottom electrode 130 forms a triangular ridge that rises from a flat surface of the second spacers 150 on either side. In one embodiment, the shape of the bottom electrode can be further etched using processes such as, for example, RIE. An embodiment of the bottom electrode can include a dome or conical shaped taper.

FIGS. 8 to 14 collectively and sequentially illustrate an example embodiment of steps in a process that may be implemented for precisely controlling the location of the filament at the center of a RRAM pillar. The processes described with respect to FIGS. 8 to 14 achieve this by converging the electric field at the tip located at the center of the bottom electrode during the electroforming process.

Figure 8:
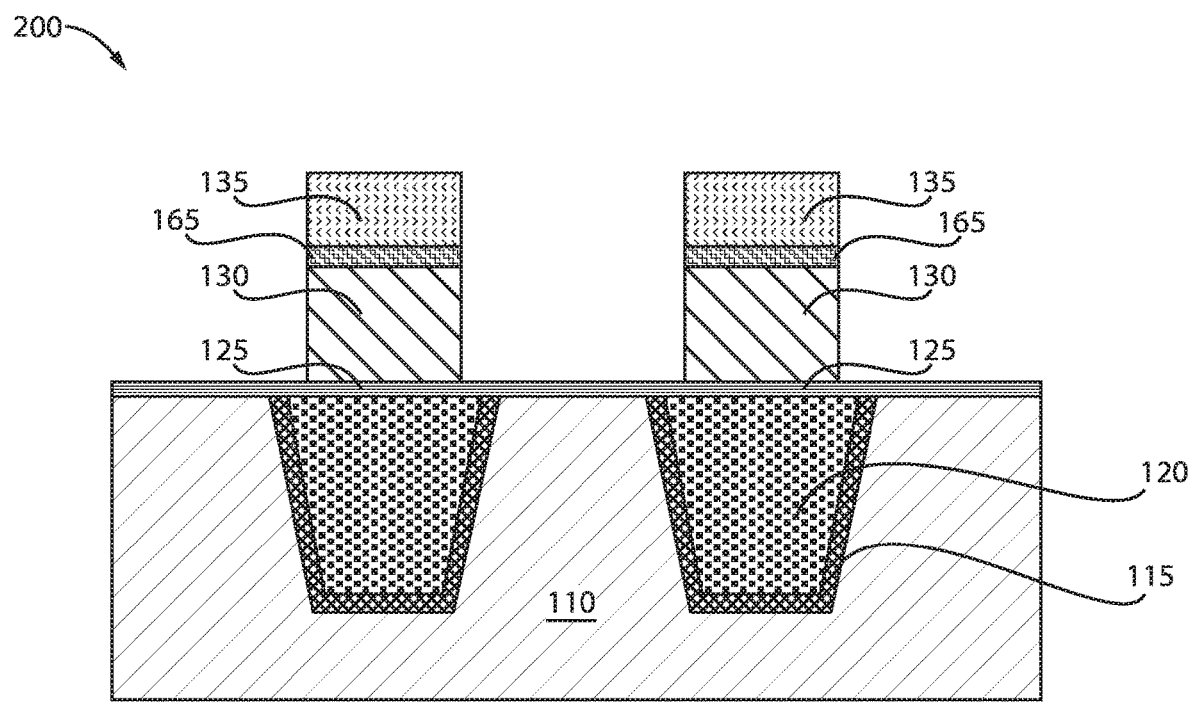
FIG. 8 is a cross-sectional view showing bottom electrode patterning, in accordance with an embodiment of the present invention.

FIG. 8 is a cross-sectional view showing bottom electrode patterning.

The device 200 can be formed from an initial structure that includes a substrate 110 with conductive lines 120 (in this example, copper (Cu) lines) embedded (for example, formed, buried, etc.) within trenches formed along a surface of the substrate 110. The conductive lines 120 are separated from the substrate 110 using, for example, a barrier layer 115 (e.g., titanium nitride).

As shown in FIG. 8, device 200 can include a conductive material 125 (for example, a conducting metallic compound material, such as titanium nitride) over a surface of the substrate 110 (which may thereby enclose the conductive lines 120 within the barrier layers 115 and 125 (for example, both layers may comprise tantalum nitride)). A bottom electrode 130 is formed (for example, deposited) on an upper surface of the device 200 over the barrier layer 125.

A top dielectric barrier layer 165 is deposited over the bottom electrode 130. Top dielectric barrier layer 165 can be formed, for example, by a directional deposition or a blanket deposition (followed, for example, by an etch-back to the intended thickness).

In one or more example embodiments, a mask 135 may be formed on a surface of the top dielectric barrier layer 165. The mask 135 overlays the top dielectric barrier layer 165, which overlays the bottom electrode 130. The bottom electrode 130 is then patterned using the mask 135. As shown, portions of the top dielectric barrier layer 165 and the bottom electrode 130 are removed (e.g., etched) such that the remaining portions of the top dielectric barrier layer 165 and the bottom electrode 130 are disposed in regions above the conductive lines 120.

Figure 9:
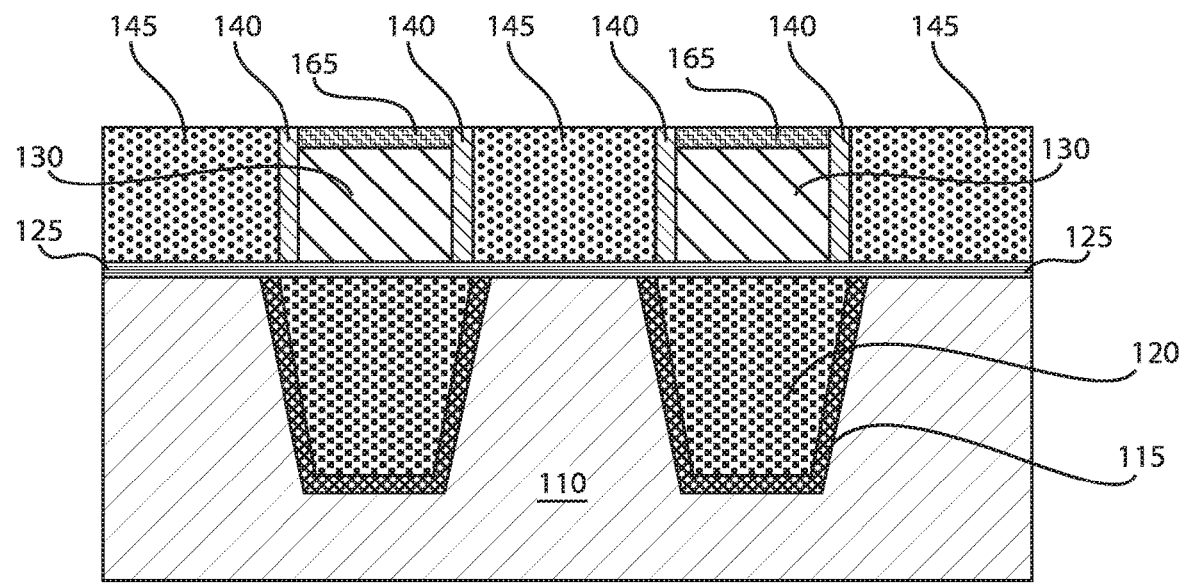
FIG. 9 is a cross-sectional view showing interlayer dielectric (ILD) deposition, and CMP with stopping on the top dielectric barriers, in accordance with an embodiment of the present invention.

FIG. 9 is a cross-sectional view showing interlayer dielectric (ILD) deposition, and CMP with stopping on the top dielectric barriers.

As shown in FIG. 9, the patterning mask is removed (for example, stripped, etc.) and sidewall spacers 140 are deposited. The sidewall spacers are disposed along the stack formed from the remaining portions of the top dielectric barrier layer 165 and the bottom electrode 130. The sidewall spacers 140 can include SiN or another suitable dielectric. The sidewall spacers 140 can be shaped to conform with the stack using directional etch back.

The ILD 145 can be formed over the surface of the substrate 110 and between the stacks formed from the remaining portions of the top dielectric barrier layer 165 and the bottom electrode 130 (enclosed in the sidewall spacers 140). The ILD 145 surrounds the stack and can be deposited to a same height as the stack formed from the remaining portions of the top dielectric barrier layer 165 and the bottom electrode 130.

The ILD 145 can include any materials known in the art, such as, for example, porous silicates, carbon doped oxides, silicon dioxides, silicon nitrides, silicon oxynitrides, or other dielectric materials. The ILD 145 can be formed using any method known in the art, such as, for example, chemical vapor deposition, plasma enhanced chemical vapor deposition, atomic layer deposition, or physical vapor deposition.

Figure 10:
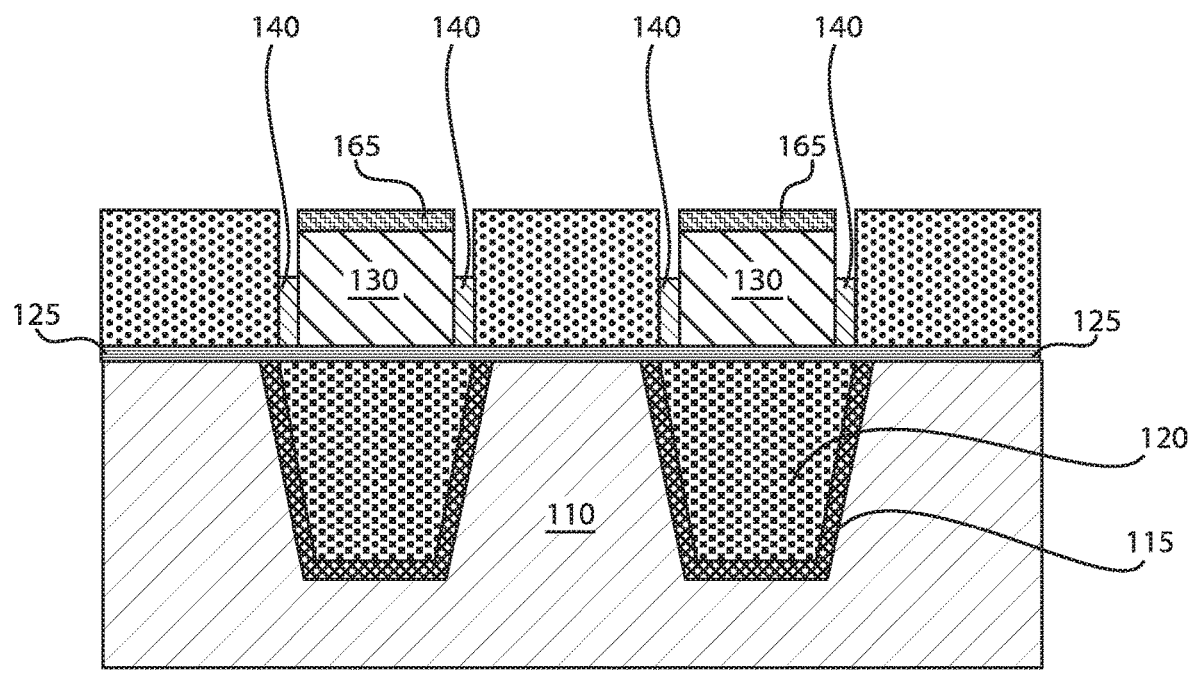
FIG. 10 is a cross-sectional view showing side-wall spacer etch, in accordance with an embodiment of the present invention.

FIG. 10 is a cross-sectional view showing side-wall spacer etching (for example, pull back, paring, etc.).

In various embodiments, a sidewall spacer etch can be performed to remove material to form lower sidewall spacers 140. Any suitable etch process can be used to perform the sidewall spacer etch in accordance with the embodiments described herein. Due to the ultraviolet (UV) condensation process(es) performed on the sidewall spacer(s) to form the hardened lower sidewall spacers, the lower sidewall spacers 140 can prevent epitaxial etch out.

Figure 11:
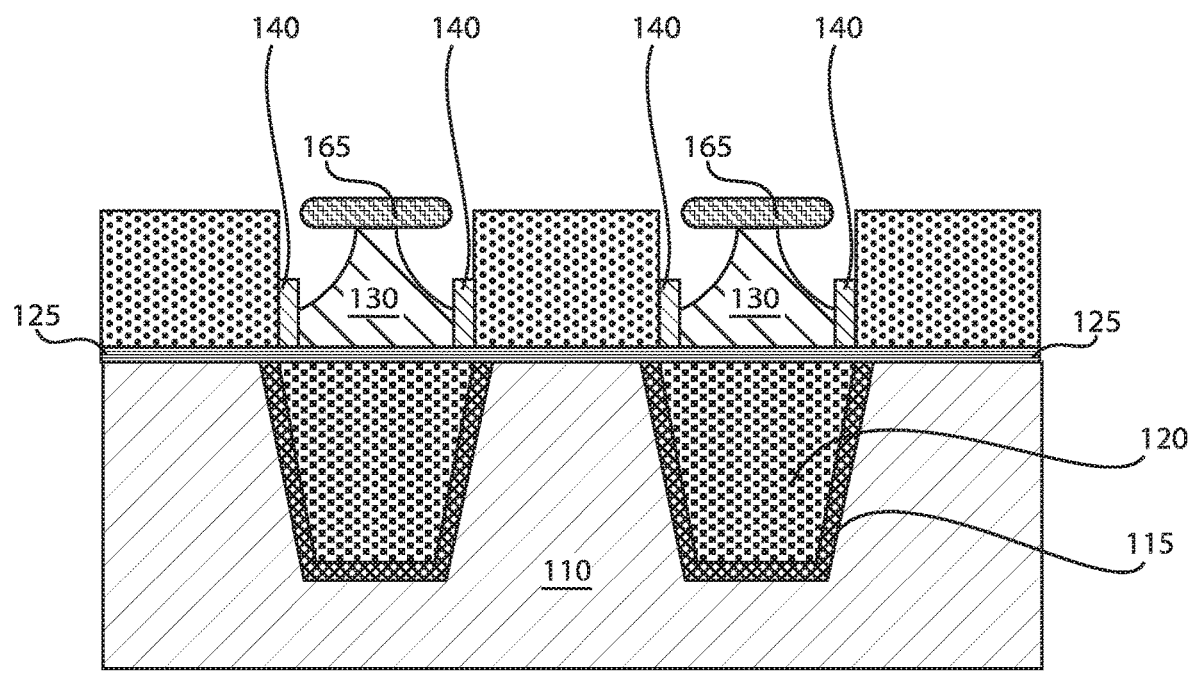
FIG. 11 is a cross-sectional view showing isotropic etch of bottom electrode with a top dielectric barrier strip before the threshold for the top dielectric barrier strip to fall, in accordance with an embodiment of the present invention.

FIG. 11 is a cross-sectional view showing isotropic etch of bottom electrode with a top barrier strip before the threshold for the top barrier strip 165 to fall.

The bottom electrode 130 is etched to form a tapered (for example, conical, pyramidic, asymptotic, etc.) shaped ridge using, e.g., an isotropic etch process. The top barrier strip 165 remains in place as the etching is performed before the threshold for top barrier 165 to fall. The top barrier strip 165 allows the bottom electrode to be etched to a more tapered form. The more tapered form converges the electric field at the tip located at the upper center of the bottom electrode during the electroforming process.

Figure 12:
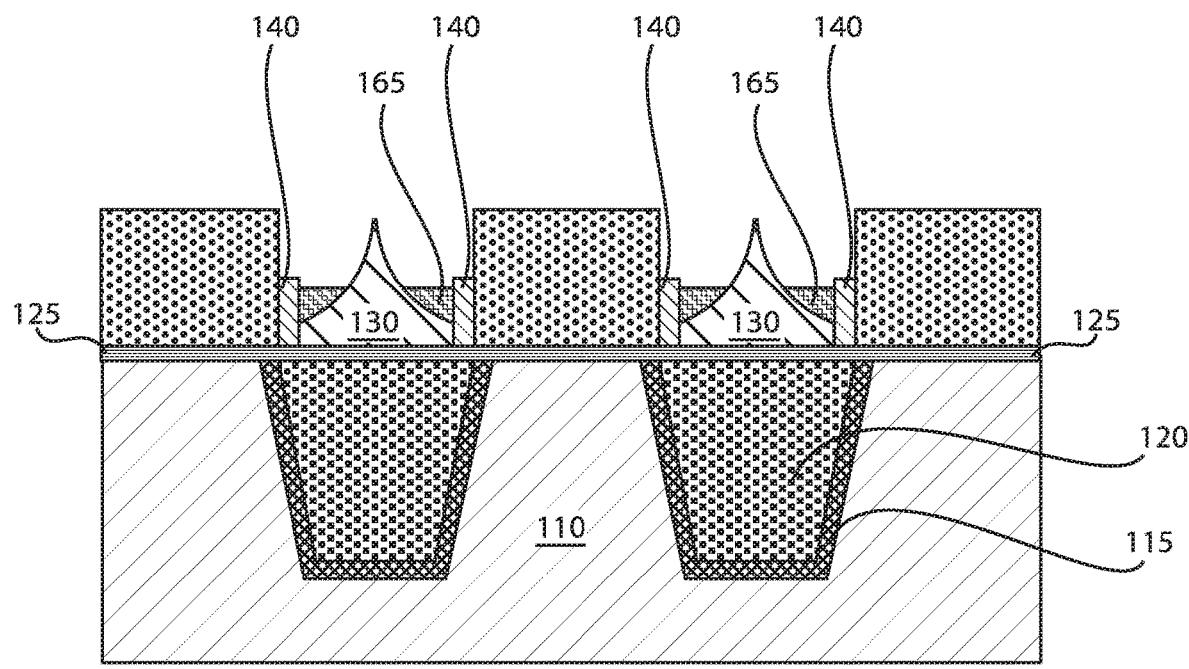
FIG. 12 is a cross-sectional view showing second spacer deposition to pinch-off the bottom corners of the bottom electrode and isotropic etch back of the second spacer, in accordance with an embodiment of the present invention.

FIG. 12 is a cross-sectional view showing second spacer deposit to pinch-off the bottom (for example, lower) corners of the bottom electrode and isotropic etch back of the second space.

The top dielectric barrier 165 is stripped while isotropic etching of the bottom electrode is continued to form sharp tip at the center. The top dielectric barrier 165 of FIG. 11 allows further etching of the electrode 130 to sharpen the tip (for example, until the threshold for the top barrier to fall has been exceeded). The isotropic etching of bottom electrode 130 is continued to form a sharp tip at the (for example, upper, top, etc.) center of the bottom electrode 130.

As shown in FIG. 12, a second spacer layer 150 is formed (for example, deposited at the lower portion of the bottom electrode). The second spacer layer 150 is deposited to pinch-off the bottom corners of the bottom electrode 130. The second spacer layer 150 can be conformally formed around the bottom electrode 130 within the first (sidewall) spacers 140. The second spacer layer 150 can include any suitable dielectric material in accordance with the embodiments described herein. For example, the second spacer layer 150 can include a low-k dielectric material. In one embodiment, the second spacer layer 150 can include the same material as the sidewall spacer layer 140. In another embodiment, the second spacer layer 150 can include a different material than the sidewall spacer layer 140.

Isotropic etch back of the second spacer layer 150 is performed. The second spacer 150 is conformed, within the sidewall spacers 140 at a level below the (etched back) sidewall spacer 140, to the sides of the bottom electrode 130.

Figure 13:
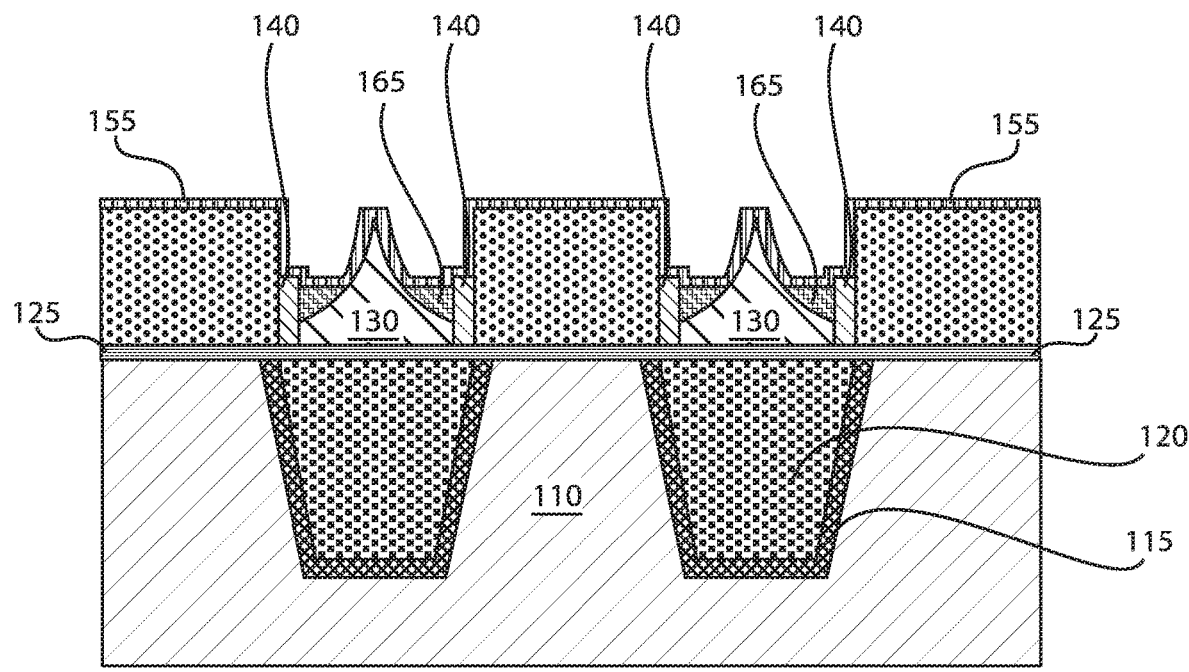
FIG. 13 is a cross-sectional view showing addition of a top dielectric layer, in accordance with an embodiment of the present invention.

FIG. 13 is a cross-sectional view showing addition of a conformal dielectric layer.

In various example embodiments, dielectric layer(s) 155 can be formed (for example, conformally) on the surface of the device including over (the exposed portions of) the ILD 145, the sidewall spacers 140, the second spacer 150 and the bottom electrode 130. The dielectric layer 155 continuously covers the bottom electrode 130 and, in some instances, the ILD 145, the sidewall spacers 140, the second spacer 150. The conformal dielectric layers 155 can include high-k dielectric layers.

A dielectric layer 155 (for example, a high-k dielectric layer) can be deposited by any suitable techniques, such as ALD, CVD, metal-organic CVD (MOCVD), physical vapor deposition (PVD), thermal oxidation, combinations thereof, or other suitable techniques.

Figure 14:
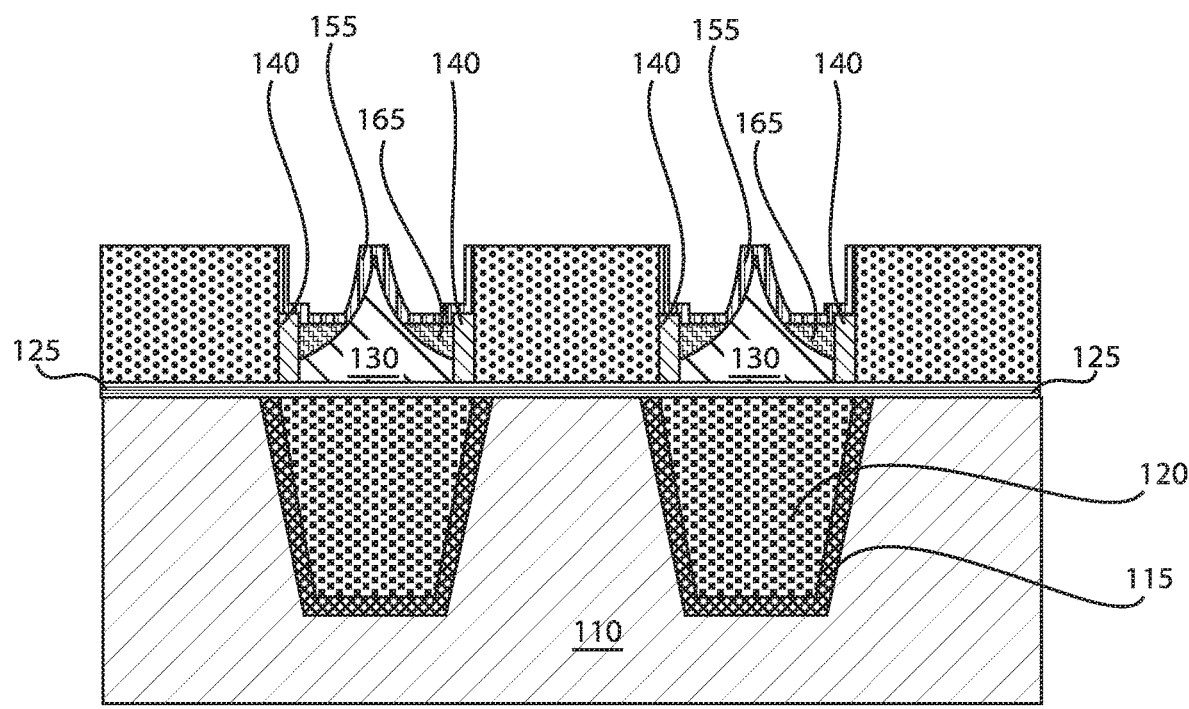
FIG. 14 is a cross-sectional view showing top electrode (TE) material deposition and CMP stopping on low-k dielectric, in accordance with an embodiment of the present invention.

FIG. 14 is a cross-sectional view showing top electrode (TE) 160 material deposition and CMP stopping on low-k dielectric.

In a non-limiting exemplary embodiments, top electrode 160 material deposition is performed on the upper surface of the structure. Top electrode 160 may include, but are not limited to, materials such as titanium-based materials (e.g., titanium nitride materials (e.g., TiN))/Al-containing alloys/TiN and W. The top electrode 160 deposition is followed by CMP stopping on low-k dielectric. The resulting structure, device 205, includes a sharp tip that tapers to a point and reduces the variability of switching characteristics by precisely controlling the location of the filament at the center of the RRAM pillar. This structure converges the electric field in the filament formation region 170 at the tip located at the center of the bottom electrode during the electroforming process. The tip is formed in a self-aligned manner by using spacers and isotropic etching of the bottom electrode material.

Figure 15:
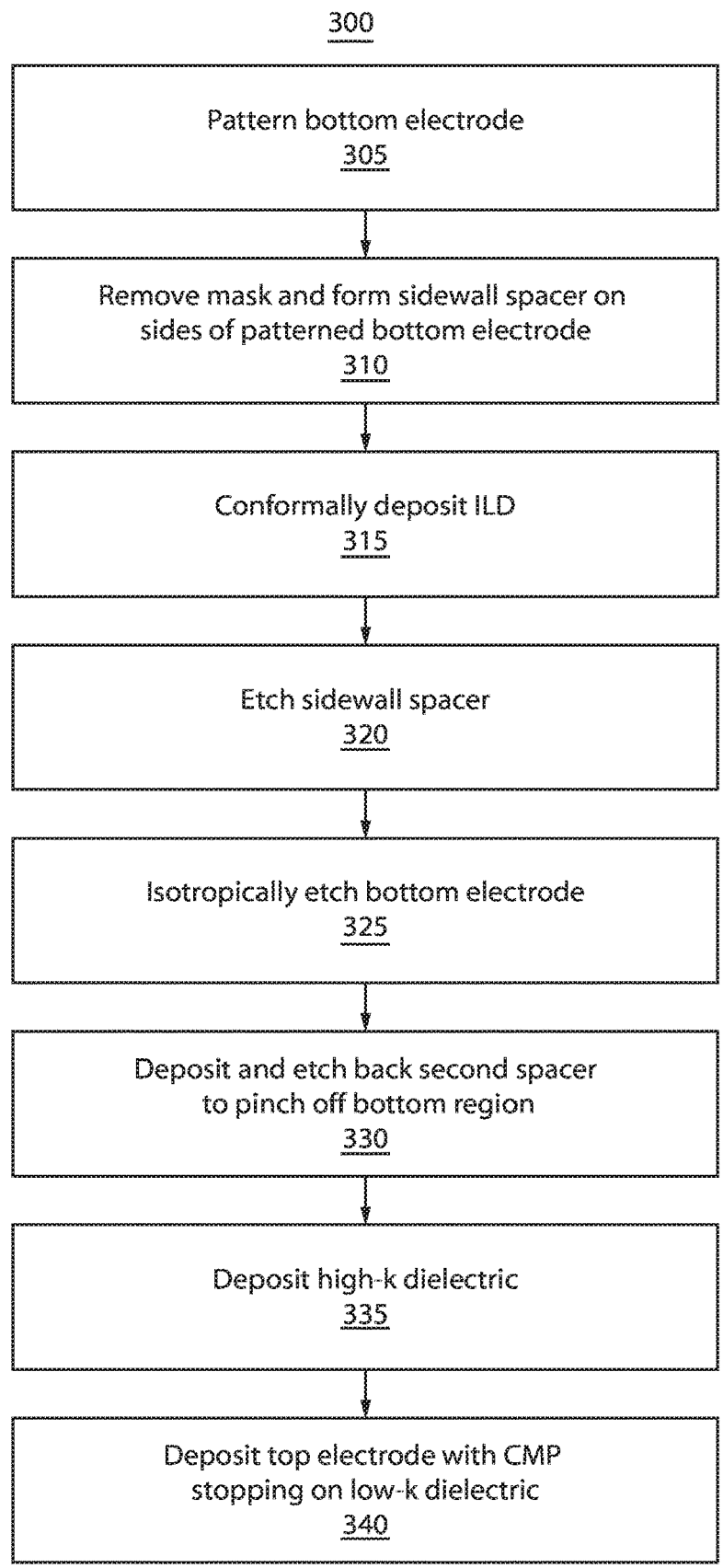
FIG. 15 is a flow diagram showing a method for confining a filament at pillar center for memory devices, in accordance with an embodiment of the present invention.

With reference to FIG. 15, a flow diagram is shown illustrating a method 300 of forming a resistive memory structure that includes confining a filament at pillar center for the memory device, in accordance with an embodiment.

In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

At block 305, a bottom electrode 130 is patterned from a structure including deposited layers. The structure may include layers as described with respect to FIG. 1 hereinabove (a barrier layer 125, a bottom electrode 130, and a mask 135) and can be patterned as described therewith. In an alternative embodiment the layers to be patterned additionally includes a top dielectric barrier layer 165, as described with respect to FIG. 8 and the ensuing FIGS. 9 to 14 herein above.

At block 310, the mask 135 is removed and a sidewall spacer 140 is formed on the sides of the patterned bottom electrode 130 (and barrier layer 125).

At block 315, the ILD 145 is conformally deposited with CMP stopping on the bottom electrode 130 (which may compose, for example, TiN), such as described herein above with respect to FIG. 2 (or with respect to an alternative embodiment, FIG. 9).

At block 320, the sidewall spacer 140 is etched to form an opening between the low-k dielectric 145 and the bottom electrode 130 (at the top of the bottom electrode 130).

At block 325, an isotropic etch of bottom electrode 130 is performed, for example, as described with respect to FIG. 4 herein above. In an alternative embodiment the bottom electrode 130 includes top barrier strip 165 before the threshold for top barrier 165 to fall, as described herein above with respect to FIG. 11.

At block 330, a second spacer 150 is deposited around the bottom region of the bottom electrode 130. The second spacer 150 is etched back in a manner to pinch off the bottom region of the bottom electrode 130.

At block 335, a high-k dielectric layer 155 is deposited. The high-k dielectric layers 155 are formed on the surface of the device including over (the exposed portions of) the ILD 145, the sidewall spacers 140, the second spacer 150 and the bottom electrode 130.

At block 340, top electrode 160 material deposition is performed with CMP stopping on low-k dielectric 145. According to an example embodiment, the filament formation region thereby formed can avoid high-k layer damage due to RIE while forming the sharp tip in the center of a RRAM device. The device includes a single conduction path in each cell.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a system and method for confining a filament at pillar center for memory devices (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device including resistive memory, comprising:
   a bottom electrode disposed on a base structure, the bottom electrode having a structure that tapers up from the base structure to a tip of the bottom electrode;
   sidewall spacers on the sides of the bottom electrode;
   an interlayer dielectric (ILD) outside the sidewall spacers;
   a top dielectric layer disposed over the bottom electrode and the sidewall spacers, the top dielectric layer having a conformal thickness portion that is in direct contact with at least a portion of a tapered sidewall of the bottom electrode and the tip of the bottom electrode; and
   a top electrode deposited over the bottom electrode within the sidewall spacers and directly on the top dielectric layer, wherein a filament formation region is formed at the tip of the bottom electrode.

2. The semiconductor device of claim 1, further comprising:
   a second spacer layer disposed within the sidewall spacers that pinches off a lower region of the bottom electrode.

3. The semiconductor device of claim 1, wherein the bottom electrode is centrally disposed within the sidewall spacers.

4. A semiconductor device including resistive memory, comprising:
   a bottom electrode disposed on a base structure, the bottom electrode having a structure that tapers up from the base structure to a sharp tip of the bottom electrode;
   sidewall spacers on sides of the bottom electrode;
   an interlayer dielectric (ILD) outside the sidewall spacers;
   a dielectric layer disposed over the bottom electrode, and the sidewall spacers, the dielectric layer having a conformal thickness in direct contact with a tapered portion of the bottom electrode and the tip of the bottom electrode, the dielectric layer including pathway sites through the dielectric layer for formation of a plurality of vacancies for ion transport; and
   a top electrode deposited over the bottom electrode within the sidewall spacers and directly on the dielectric layer, wherein a filament formation region is formed at the sharp tip of the bottom electrode, the pathway sites extending from the filament formation region through the dielectric layer.

5. The device of claim 4, further comprising:
   a second spacer layer disposed within the sidewall spacers that pinches off a lower region of the bottom electrode.

6. The device of claim 5, wherein the filament region is at a center of a tip of the patterned bottom electrode.

7. The device of claim 4, wherein the bottom electrode is a ridge with one of a conical shape, an asymptotic shape or a dome shape.

8. The device of claim 4, wherein the bottom electrode is centrally disposed within the sidewall spacers.

* * * * *